United States Patent

Slawek, Jr. et al.

[15] 3,704,375

[45] Nov. 28, 1972

[54] MONOLITHIC DETECTOR CONSTRUCTION OF PHOTODETECTORS

[72] Inventors: Joseph E. Slawek, Jr., Trumbull; Harvey W. Altemose, Norwalk, both of Conn.

[73] Assignee: Barnes Engineering Company, Stamford, Conn.

[22] Filed: May 5, 1970

[21] Appl. No.: 34,668

[52] U.S. Cl. ............................250/211 J, 317/235 N

[51] Int. Cl. ..............................................H01l 15/00

[58] Field of Search .........250/211 J, 212; 317/235 N

[56] References Cited

UNITED STATES PATENTS

| | | | |
|---|---|---|---|
| 3,488,636 | 1/1970 | Dyck | 250/220 X |
| 3,577,175 | 5/1971 | Gri | 317/237 |
| 3,530,299 | 9/1970 | Sandbank et al. | 250/211 J |
| 3,539,883 | 11/1970 | Harrison | 317/235 N X |
| 3,344,278 | 9/1967 | Yanai | 250/211 J |
| 3,478,214 | 11/1969 | Dillman | 317/235 N X |
| 3,366,789 | 1/1968 | Allen | 250/212 X |
| 3,529,217 | 9/1970 | Van Santen | 250/211 J X |
| 3,435,232 | 3/1969 | Sorensen | 250/211 J X |

*Primary Examiner*—Walter Stolwein
*Attorney*—Joseph Levinson and Robert Ames Norton

[57] ABSTRACT

Photodetector single-element and multi-element arrays of the photovoltaic type are fabricated by photoetching and sensitizing a large semi-conductor PN junction wafer for delineating the desired active junctions. An evaporated coating of dielectric material is supplied covering only a small portion of each active element and then followed by a metallic coating which makes ohmic contact with the active elements. The entire region except for the external lead pattern is then passivated with a coating of dielectric material. A metallic coating is then applied to overlay the ohmic contact areas of the active element. The wafer is then diced into individual detectors or arrays which are mounted on substrates and external leads are then connected to the external lead pads. This construction then allows for the application of interference filters, apertures stops, coded reticles, and/or guard rings to each detector element.

10 Claims, 5 Drawing Figures

INVENTORS.
JOSEPH E. SLAWEK JR.
HARVEY W. ALTEMOSE
BY Joseph Levinson
ATTORNEY

INVENTORS
JOSEPH E. SLAWEK JR.
HARVEY W. ALTEMOSE
BY Joseph Levinson
ATTORNEY

MONOLITHIC DETECTOR CONSTRUCTION OF PHOTODETECTORS

BACKGROUND OF THE INVENTION

This invention relates to radiation detectors of the photodetector type, and more particularly to photovoltaic detector devices and the construction technology associated therewith.

A photovoltaic radiation detector utilizes the photoelectric effect which occurs in the vicinity of a PN junction in certain types of semiconductor materials when they are exposed to radiation. The choice of a particular semiconductor material will determine the wavelength response antimonide a particular detector to the radiation applied thereto. Indium anitmonide and indium arsenide are examples of such materials. Detectors of this type which are sensitive in the intermediate infrared region generally require cooling to relatively low temperatures, such as that of liquid nitrogen at 77°K. In the conventional fabrication of the photovoltaic detectors, a PN junction is formed in a single crystal wafer of material by the high temperature diffusion of an appropriate impurity. The diffused wafer, with a broad area PN junction located just below its surface, is then processed into individual detector elements. In the case of InSb or InAs detectors, a selective photoetching technique is used on the wafers to delineate the individual detector elements by removing the diffused P-region material from everywhere on the wafer except on areas where an active detector element is to be formed. The wafer is then scribed into small pieces, each of which contains a photoetched PN junction located centrally on a small chip of material. The individual chips are then soldered to a suitable substrate with the photoetched junction facing away from the substrate. A small gold wire is then soldered to the P-region or anode of the photoetched mesa junction. The thus assembled detector element is put through preliminary measurements to determine its quantum efficiency, and then sensitized by trimming the P-region of the detector to a point where optimum quantum efficiency is achieved. The sensitizing is accomplished by a series of chemical etches which remove a small portion of the P-region detector material.

After sensitizing, the detector is coated with an evaporated layer of dielectric material which protects the detector surfaces from contamination, and also serves as an anti-reflection coating to increase quantum efficiency. Due to the abrupt surface discontinuity at the interface between the anode lead wire and the semiconductor surface, complete surface passivation is never achieved, which leads to lower over-all device yields and decreased detector reliability. After the application of the protective coating, the detector is put into a Dewar package which is then finally evacuated.

The aforesaid conventional techniques for photovoltaic detector and detector array fabrication require the bonding of individual wire leads to each detector element. The individual wire lead bonding is expensive and susceptible to in-process damaging of detector elements, particularly with respect to arrays, since a ruined element in an array requires the discarding of the entire array. Also, the individually bonded leads have been found to interfere with methods for obtaining detector spatial definition and the maximum utilization of field-of-view masking. With respect to multi-element configurations, array configuration where up to 200 individual leads must be attached, the conventional lead bonding techniques present very serious limitations on detector array construction.

The conventional detector construction also requires that every detector element be individually sensitized for optimum quantum efficiency. This is a time consuming and variable process, where the largest portion of manufacturing costs are incurred. Furthermore, the surfaces of the detector elements are incompletely passivated, which reduces the over-all efficiency of the detector and could lead to surface contamination requiring the detector to be rejected.

Accordingly, it is an object of this invention to provide a new and improved photovoltaic detector and detector array which alleviate the aforesaid problems.

Another object of this invention is to provide a monolithic processing technique for the fabrication of individual and arrays of detector elements which is less expensive and time consuming and provides more uniform photovoltaic detectors and makes multiple arrays of such detectors more practical.

Still another object of this invention is to provide new and improved detectors and detector arrays which are fully passivated, which permits the integral construction of interference filters, aperture stops, coded reticles, and/or guard rings to said detectors or detector arrays.

Still another object of this invention is to provide a monolithic detector construction which eliminates the need for individual lead wire bonding and individual detector sensitizing.

SUMMARY OF THE INVENTION

In carrying out this invention in one illustrative embodiment thereof, photodetectors and arrays are fabricated using a monolithic processing technique which utilizes a series of evaporated thin films. After delineating the desired active junctions on a large semiconductor PN-junction wafer, an evaporated dielectric coating is applied covering only a small portion of the active element of each junction and then followed by metallic coatings which form ohmic contact with the active elements. Another dielectric coating is applied which covers the entire active junction area, which is followed by another metallic coating which overlays the ohmic contact areas of the active elements. Subsequent coatings may then be applied to form interference filters, aperture stops, coded reticles, and/or guard rings for each detector element.

DESCRIPTION OF THE PREFERRED EMBODIMENT

As has been pointed out, while the monolithic construction of detectors is applicable to photodetectors including both photovoltaic and photoconductive detector devices, its main applications will be found with photovoltaic detectors, and therefore the description of the invention will be made with respect to photovoltaic devices. In the fabrication of photovoltaic detectors, a PN junction is formed in a single crystal wafer of material by high temperature diffusion of an appropriate impurity. For example, in the case of an indium antimonide photovoltaic detector, a wafer of indium antimonide, which is N-type material, has diffused therein the P-type material cadmium. The diffused wafer, having a broad area PN junction located just below the surface, is then processed in accordance with this invention.

Figure 1:
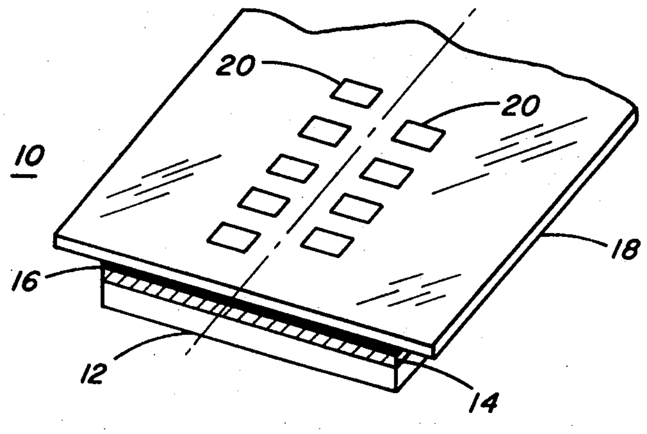
FIG. 1 is an isometric view illustrating the photoresist process which may be utilized in the initial stages of the fabrication of detectors and arrays in accordance with this invention.
Figure 2:
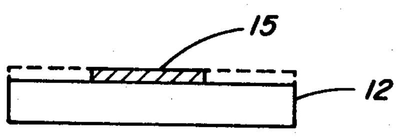
FIG. 2 shows a front view of the PN junction formed by a photoresist process or other method to delineate an active junction which is then processed in accordance with this invention.

In the case of InSb or InAs detectors, selective photo-etching technique is used on the wafer to delineate the individual detector element. As will be seen in FIG. 1, the wafer 10 is comprised of a layer 12 of N-type material with a layer 14 of P-type material which has been diffused in the wafer. The P-type layer 14 is covered with a photoresist film and light is applied thereto through a clear negative mask 18 except through the blocked-out portions 20 which provide a pattern for the active junctions which are to be formed by the process. The pattern placed on the photoresist film 16 through the clear negative mask 18 is then chemically etched to produce the photoetched mesa junction 15 as shown on FIG. 2. FIG. 2 shows only a single element which is merely illustrative of the multiplicity of mesa junctions 15 which will be formed by the process, depending on the pattern put on the photoresist by the mask 18. One of the advantages of this invention is that a number of elements may be fabricated simultaneously.

Figure 3:
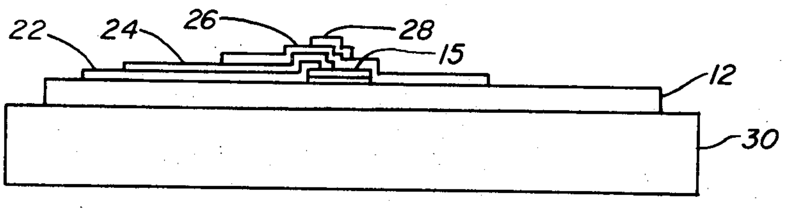
FIG. 3 is a cross-sectional view of an individual detector constructed in accordance with this invention.
Figure 4:
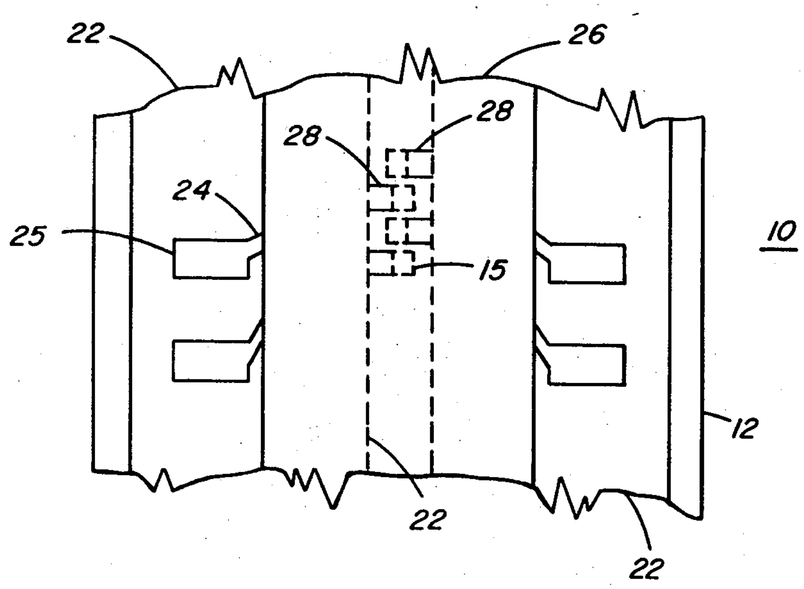
FIG. 4 is a top view illustrating a detector array fabricated in accordance with this invention.

After the geometry of the individual detectors or detector array has been delineated, the next step in the processing is to sensitize the individual detector elements, which involves chemical etching the entire detector array surface to selectively remove some of the P-region of each detector. This procedure optimizes the thickness of the detector's PN junctions for maximum quantum efficiency. At the same time, the chemical etching removes any leakage paths from around the periphery of each junction which results in a clean diode behavior with low $1/f$ noise characteristics and reasonably high impedance levels. After sensitizing, the wafter 10 is placed in a high vacuum bell jar system for the monolithic processing, where all critical processing steps are carried out in a conventional high-vacuum evaporator. An evaporated coating of dielectric material 22 is applied through a suitable mask to the wafer 10, covering only a small portion of each active mesa junction 15. Silicon monoxide is an example of one type of dielectric material which can be used. The casting 22 is shown in FIG. 3, and its general shape with respect to the wafer 10 is shown on FIG. 4. The thickness of the coating 22 may be on the order of 0.5 microns. The evaporated coating 22 of dielectric material then sets the stage for the metallic lead evaporation step which follows. An evaporated metal coating is then applied through a suitable mask containing the lead frame pattern over the coating 22 and extending over the coating 22 to each mesa junction 15 to make ohmic contact therewith in the P-region of each active element or mesa junction 15. A two-layer coating having a thickness on the order of 10 microns of chrome-gold has been found suitable for this purpose. FIGS. 3 and 4 show the metallic lead pattern 24 which makes ohmic contact with the P-type material on one extremity thereof and terminates in a connected pad 25 as shown in FIG. 4 on the other extremity thereof. The lead pattern 24 is insulated by the dielectric coating 22 from the N-layer 12 of the wafer 10.

At this point, in the processing, another layer of dielectric material 26 is applied over the entire active regions of the wafer 10. The only areas not covered are part of the head pattern 24 and its associated connection pad 25. This coating of suitable dielectric material, for example silicon monoxide, with a thickness on the order of 1–6 microns, completely passivates all detectors, making them impervious to degradation due to contamination. At this point in the process, a metallic mask 28 of suitable material such as gold or aluminum is applied to block out the sensitive elements in the area of the lead connection making ohmic contact to the anode of junction 15 of each detector.

The wafer 10 is then removed from the evaporation chamber and is diced by scribing the wafer into small pieces, each containing an individual detector element or individual detector array. Individual pieces representing either individual detectors or arrays are attached to a suitable substrate 30 of ceramic material such as beryllium oxide. Then an ultrasonic lead bonder is used to connect leads from the evaporated lead pads 25 on the detector materials to suitable lead pads on the substrate 30. It is important to note at this point that in the monolithic processing embodied in this invention, the lead bonding operation is carried out on a pad of evaporated metal insulated from the detector material by dielectric, as contrasted to being carried out over the active detector PN junction where punch-through or burn-out has been experienced when using conventional techniques. Final packaging and evacuation are then completed.

Figure 5:
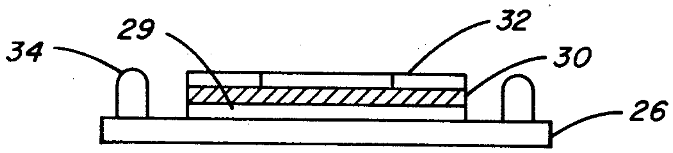
FIG. 5 is a cross-sectional view showing additional evaporative layers which may be deposited on the detector as shown in FIG. 3, either singly or in combination.

FIG. 5 illustrates additional coatings which can be applied using the monolithic processing techniques embodied in this invention. Because of the high quality of the passivation coatings 26, coded reticles 29, interference filters 30, aperture stops 32, and/or guard rings 34 may be applied to each detector element. These additional elements may be added either singly or in combination, depending on the particular application to which the individual detector or detector arrays are to be utilized. In addition to resulting in a completely integrated detector package, this technique reduces reflection losses normally associated with separate filters, aperture stops, and reticles. It will appear obvious that if an aperture stop 32 is used for defining the field of view of the active detector elements, the coating 28 would not be necessary. The elimination of many individual lead wires previously required more readily permits the incorporation of field-of-view reticles and interference filters to enhance the detector performance. Furthermore, with these types of elements incorporated directly and integrated with the detector, they are cooled in the detector package and present fewer problems in cooling than when they were attached separately or positioned outside the array and Dewar package. The complete detector passivation allows the application of guard rings 34 which have served to increase device reliability and performance. The guard ring is generally an evaporated metal film deposited around the periphery of the active area of the detector device. The guard ring is insulated from the device and is used to alter the field lines at the periphery of the device junction to thereby decrease leakage currents and other surface phenomena. In operation, a DC potential is applied to the guard ring 34 to alter the field lines at the junction 15.

The detector construction and monolithic processing techniques embodied in this invention are applicable to single detector and multiple detector arrays which can be produced more uniformly to increase the reliability and reduce the reject quantities in photovoltaic detector production. The construction eliminates the need for individual anode lead attachments to the active junctions and the resultant burn-outs associated therewith. All lead bonding is performed away from the active elements of the detectors. The complete passivation coating enables the adding of additional coatings to enhance detector performance.

Since other modifications and changes varied to fit particular operating requirements and environments will be apparent to those skilled in the art, the invention is not considered limited to the examples chosen for purposes of disclosure and covers all modifications which do not constitute departures from the true spirit and scope of this invention.

We claim:

1. Photoelectric detector means comprising
   a. a wafer of material having at least one delineated active P-N junction exhibiting a photoelectric effect formed thereon,
   b. a first layer of dielectric material covering a major portion of said wafer and only a small edge portion of said active P-N junction, constituting a minority of the total area of said active P-N junction,
   c. a lead pattern layer of conductive material positioned on said first layer of dielectric material which extends over the small edge portion of said active P-N junction covered by said first layer and makes ohmic contact with said active P-N junction on one extremity thereon and terminates in a lead connection areas on the other extremity thereon which rests on said first layer of dielectric material to insulate said lead connection area from said wafer,
   d. a second layer of dielectric material overlaying the entire active P-N junction area including at least the portion of the lead pattern layer making ohmic contact with said active P-N junction for completely passivating said active P-N junction, and
   e. a substrate having said wafer mounted thereon.

2. The photodetector means set forth in claim 1 wherein said wafer includes a plurality of active P-N junctions each of which contains the layers recited in claim 1 to form a detector array.

3. The photodetector means set forth in claim 1 having an interference filter mounted on said second layer of dielectric material over said active P-N junction.

4. The photodetector means set forth in claim 1 having an aperture stop mounted on said second layer of dielectric material over said active P-N junction.

5. The photodetector means set forth in claim 1 having a coded reticle mounted on said second layer of dielectric material over said active P-N junction.

6. The photodetector means set forth in claim 1 having a guard ring mounted on said second layer of dielectric material surrounding said active P-N junction.

7. The photodetector means set forth in claim 2 having an interference filter mounted on said second layer of dielectric material over each said active P-N junction.

8. The photodetector means set forth in claim 2 having an aperture stop mounted on said second layer of dielectric material over each said active P-N junction.

9. The photodetector means set forth in claim 2 having a coded reticle mounted on said second layer of dielectric material over each said active P-N junction.

10. The photodetector means set forth in claim 2 having a guard ring mounted on said second layer of dielectric material surrounding each said active P-N junction.

* * * * *